US011728825B2

(12) United States Patent
Ezrielev et al.

(10) Patent No.: US 11,728,825 B2
(45) Date of Patent: Aug. 15, 2023

(54) CLUSTER-BASED DATA COMPRESSION FOR AI TRAINING ON THE CLOUD FOR AN EDGE NETWORK

(71) Applicant: Dell Products L.P., Round Rock, TX (US)

(72) Inventors: Ofir Ezrielev, Be'er Sheba (IL); Nadav Azaria, Meitar (IL); Avitan Gefen, Lehavim (IL); Amihai Savir, Sansana (IL)

(73) Assignee: Dell Products L.P., Round Rock, TX (US)

( * ) Notice: Subject to any disclaimer, the term of this patent is extended or adjusted under 35 U.S.C. 154(b) by 128 days.

(21) Appl. No.: 17/509,759

(22) Filed: Oct. 25, 2021

(65) Prior Publication Data

US 2023/0127149 A1   Apr. 27, 2023

(51) Int. Cl.
| | |
|---|---|
| *H03M 7/00* | (2006.01) |
| *H03M 7/30* | (2006.01) |
| *H04L 67/10* | (2022.01) |
| *G06N 3/02* | (2006.01) |
| *G06F 18/23213* | (2023.01) |

(52) U.S. Cl.
CPC .... *H03M 7/3059* (2013.01); *G06F 18/23213* (2023.01); *G06N 3/02* (2013.01); *H03M 7/6005* (2013.01); *H03M 7/6011* (2013.01); *H04L 67/10* (2013.01)

(58) Field of Classification Search
CPC .............................. G06F 16/285; G06N 20/00
USPC ..................................................... 341/50, 51
See application file for complete search history.

(56) References Cited

U.S. PATENT DOCUMENTS

| | | | | |
|---|---|---|---|---|
| 10,467,276 | B2* | 11/2019 | Gonnet | G06F 16/35 |
| 10,805,173 | B1* | 10/2020 | Janakiraman | H04L 43/062 |
| 2019/0251097 | A1* | 8/2019 | Shmueli | G06F 3/067 |
| 2019/0339965 | A1* | 11/2019 | Garvey | G06F 16/24578 |
| 2020/0265111 | A1* | 8/2020 | Jha | G06F 16/285 |
| 2020/0322227 | A1* | 10/2020 | Janakiraman | H04L 41/147 |

OTHER PUBLICATIONS

Varghese, B. et al., "Challenges and Opportunities in Edge Computing", Proceedings of the IEEE International Conference on Smart Cloud (IEEE SmartCloud), 2016.

(Continued)

*Primary Examiner* — Jean B Jeanglaude
(74) *Attorney, Agent, or Firm* — Jackson Walker L.L.P (57) ABSTRACT

A disclosed information handling system includes an edge device communicatively coupled to a cloud computing resource. The edge device is configured to respond to receiving, from an internet of things (IoT) unit, a numeric value for a parameter of interest by determining a compressed encoding for the numeric value in accordance with a non-lossless compression algorithm. The edge device transmits the compressed encoding of the numeric value to the cloud computing resource. The cloud computing resource includes a decoder communicatively coupled to the encoder and configured to respond to receiving the compressed encoding by generating a surrogate for the numeric value. The surrogate may be generated in accordance with a probability distribution applicable to the parameter of interest. The compression algorithm may be a clustering algorithm such as a k-means clustering algorithm.

18 Claims, 4 Drawing Sheets

(56) References Cited

OTHER PUBLICATIONS

Kingma, Diederik P. et al., "Auto-encoding variational bayes", arXiv preprint arXiv:1312.6114, 2013.
Baraniuk, Richard G. et al., "Model-Based Compressive Sensing", IEEE Transactions on Information Theory 56.4, pp. 1982-2001, 2010.
Biswas, Aniket et al., "A New Method for Constructing Continuous Distributions on the Unit Interval", arXiv preprint arXiv:2101.04661, 2021.

* cited by examiner

CLUSTER-BASED DATA COMPRESSION FOR AI TRAINING ON THE CLOUD FOR AN EDGE NETWORK

TECHNICAL FIELD

The present disclosure relates to distributed computing systems and, more particularly, performance and security within edge computing environments.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications.

Information handling systems encompass distributed systems comprising two or more networked information handling resources, including hardware and software resources, interacting in the processing, storing, and/or communicating of information. Edge computing is an important and expanding example of a distributed system. In an edge computing environment, edge devices aggregate data from internet of thing (IoT) units and relay the information to centralized cloud computing resources. In at least some distributed systems, including at least some edge computing environments, user satisfaction is highly correlated to adequate performance including, as non-limiting examples, stable and reliable data transfer rates exceeding a particular data transfer threshold and stable and reliable latency below a specified latency threshold. Accordingly, it is desirable to meet the customer's preferences.

SUMMARY

Common problems associated with performance constraints within edge computing environments and other distributed systems are addressed by methods and systems disclosed herein. In one aspect, a disclosed information handling system includes an edge device, communicatively coupled to a cloud computing resource, configured to perform disclosed edge operations. In at least one embodiment, the edge device is configured to respond to receiving, from an internet of things (IoT) unit, a numeric value for a parameter of interest by determining a compressed encoding for the numeric value in accordance with a non-lossless or "lossy" compression algorithm. The edge device transmits the compressed encoding of the numeric value to the cloud computing resource.

The cloud computing resource includes a decoder communicatively coupled to the encoder and configured to perform cloud operations. In at least one embodiment, the cloud operations include responding to receiving the compressed encoding by generating an estimate or proxy, referred to herein as a surrogate, for the numeric value. The surrogate may be generated based on or otherwise in accordance with a probability distribution applicable to the parameter of interest.

In at least one use case, the cloud computing resource includes an artificial intelligence (AI) resource and surrogate values generated by the decoder are used as training data, i.e., to configure a trained model for the AI engine.

The lossy compression algorithm may be a clustering algorithm that assigns each numeric value to one of a plurality of clusters derived from historical data. In such embodiments, the compressed encoding may identify the selected cluster. For example, if the plurality of clusters includes a total of four clusters, the compressed encoding may be a 2-bit binary value identifying one of the four clusters as the selected cluster. If the numeric value is represented in any of various familiar formats such as single, double, or extended precision floating point format, it will be readily appreciated that the compressed encoding may be conveyed with a fraction of the data required to convey the numeric value itself.

For embodiments that employ a clustering algorithm to generate the compressed encodings of numeric values, the operations performed by the encoder may include deriving, calculating, initializing or otherwise determining the plurality of clusters from an initial vector of historical values. In such embodiments, each of the plurality of clusters may be defined by small number of parameters including, as an example, a mean value and a variance value indicating, for example, a standard deviation of the cluster. In these embodiments, the plurality of clusters may be entirely conveyed with as little as two n-dimensional vectors where "n" is a hyperparameter corresponding to the number of clusters, sometimes referred to herein as the cluster count. For example, the first n-dimensional vector may indicate the mean value corresponding to each of the n clusters while the second vector may indicate a variance parameter, such as a standard deviation, for each of the n clusters. Thus, the encoder may be configured to access the cluster count and to perform a pre-defined clustering algorithm on a vector of historical values in accordance with the cluster count.

The decoder is configured to generate a surrogate value for each compressed encoding. In some embodiments, depending on the clustering algorithm and the values in the initial vector of values, some or all of the clusters may exhibit a Gaussian distribution characteristic. For such clusters, the decoder may generate a surrogate for each numeric value by simply providing a random input to a Gaussian distribution function. In other embodiments, none or few of the clusters may exhibit Gaussian behavior and, for these clusters, the decoder may invoke a service or other type of functionality to generate an approximation of the density function for the applicable cluster. The ability to utilize non-Gaussian distributions may beneficially enable the use of fewer clusters and thereby further improving the overall efficiency of the system.

Disclosed methods and systems for clustering numeric values, in conjunction with disclosed processes for generating surrogates based on a probability distribution of the clusters, in addition to significantly reducing the amount of data communicated between edge devices and cloud computing resource, inherently and beneficially injects random noise into the training data and thereby results in a more robust and stable training model.

In a second aspect of disclosed edge computing systems and methods, an edge device again determines an initial set of "n" clusters based on historical data and a hyperparameter stipulating the value of "n" In this aspect, however, new values received by the edge device from the IoT unit have been corrupted or poisoned with adversarial data intended to negatively influence the trained model of the AI engine.

In this case, after the appropriate cluster for the numeric value is identified, a sample value from the cluster's underlying distribution is obtained. This sample or surrogate value, which is free of adversarial modification, is provided to an AI engine that will draw an inference based on the surrogate value. In this manner, the adversarial data is eliminated in exchange for a small increase in random noise associated with the surrogate value. However, since random noise is inherent in AI systems and, in some instances, explicitly introduced to improve generalization capabilities, the tradeoff is unambiguously advantageous in improving the functionality, stability, and security of the AI engine and the corresponding trained model.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Exemplary embodiments and their advantages are best understood by reference to FIGS. 1-4, wherein like numbers are used to indicate like and corresponding parts unless expressly indicated otherwise.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

Additionally, an information handling system may include firmware for controlling and/or communicating with, for example, hard drives, network circuitry, memory devices, I/O devices, and other peripheral devices. For example, the hypervisor and/or other components may comprise firmware. As used in this disclosure, firmware includes software embedded in an information handling system component used to perform predefined tasks. Firmware is commonly stored in non-volatile memory, or memory that does not lose stored data upon the loss of power. In certain embodiments, firmware associated with an information handling system component is stored in non-volatile memory that is accessible to one or more information handling system components. In the same or alternative embodiments, firmware associated with an information handling system component is stored in non-volatile memory that is dedicated to and comprises part of that component.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically. Thus, for example, "device 12-1" refers to an instance of a device class, which may be referred to collectively as "devices 12" and any one of which may be referred to generically as "a device 12".

As used herein, when two or more elements are referred to as "coupled" to one another, such term indicates that such two or more elements are in electronic communication, mechanical communication, including thermal and fluidic communication, thermal, communication or mechanical communication, as applicable, whether connected indirectly or directly, with or without intervening elements.

Figure 1:
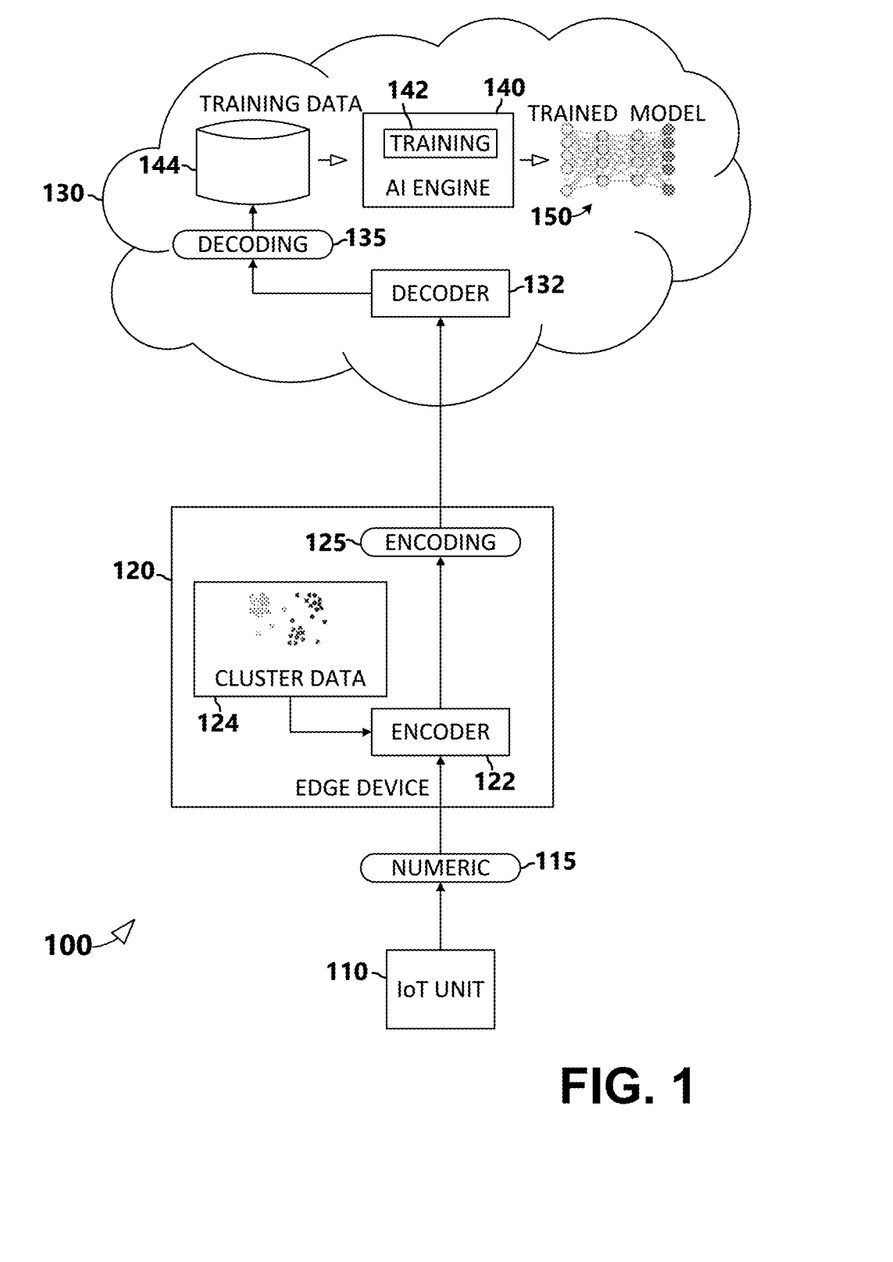
FIG. 1 illustrates an edge computing environment in accordance with a disclosed system for employing a lossy compression algorithm in conjunction with training an AI engine.

Referring now to the drawings, FIG. 1 is a block diagram illustration of an information handling system 100 in accordance with a first aspect of disclosed subject matter. The information handling system 100 illustrated in FIG. 1 includes an IoT unit 110 communicatively coupled to an edge device 120. Edge device 120 is coupled to cloud computing resources 130. IoT unit 110 generates numeric information and transmits numeric data 115 to edge device 120. Edge device 120 includes an encoder 122 configured to receive numeric data 115 from IoT unit 110 and to generate a compressed encoding 125 of numeric data 115. The compressed encoding 125 is transmitted from edge device 120 to a decoder 132 within cloud computing resources 130. Decoder 132 produces a decoding 135 corresponding to the compressed encoding 125. Decoding 135 is provided to an AI resource 136.

In at least one embodiment, the encoder 122 illustrated in FIG. 1 is a cluster-based encoder that accesses and utilizes cluster data 124 to produce the compressed encoding 125. Edge device 120 may generate the clusters represented by cluster data 124 based on historical data using any of various clustering algorithms including, but not limited to, a k-means clustering algorithm. In embodiments employing a k-means clustering algorithm, encoder 122 may receive a value "n" as a hyperparameter indicating the number of clusters and a vector containing historical values generated by the IoT unit. Encoder 122 may then perform the k-means clustering algorithm on the historical data vector to determine the n clusters represented by cluster data 124.

Each of the clusters may be characterized by a mean value and a corresponding variance value. Cluster data 124, which represents all "n" of the clusters, may include a pair of n-dimensional vectors including a mean vector containing mean values for each of the "n" clusters and a variance vector containing variance values for each of the "n" clusters.

Encoder 122 may transmit cluster data 124 to decoder 132. In such embodiments, decoder 132 may generate decoding 135 by using the compressed encoding 125 to identify the cluster to which numeric data 122 was assigned by encoder 122 and then sampling the applicable cluster in accordance with the cluster's probability density characteristics. Encoder 122 may update cluster data periodically or from time to time in response to one or more specified criteria and/or events.

The cloud computing resource 130 illustrated in FIG. 1 includes, in addition to decoder 132, an AI engine 140 including a training module 142 and a training data database 144. Training module 142 is suitable for use in conjunction with AI engine 140 and training data 144 to produce a trained model 150 as will be appreciated by those of ordinary skill in the field of artificial intelligence.

Figure 2:
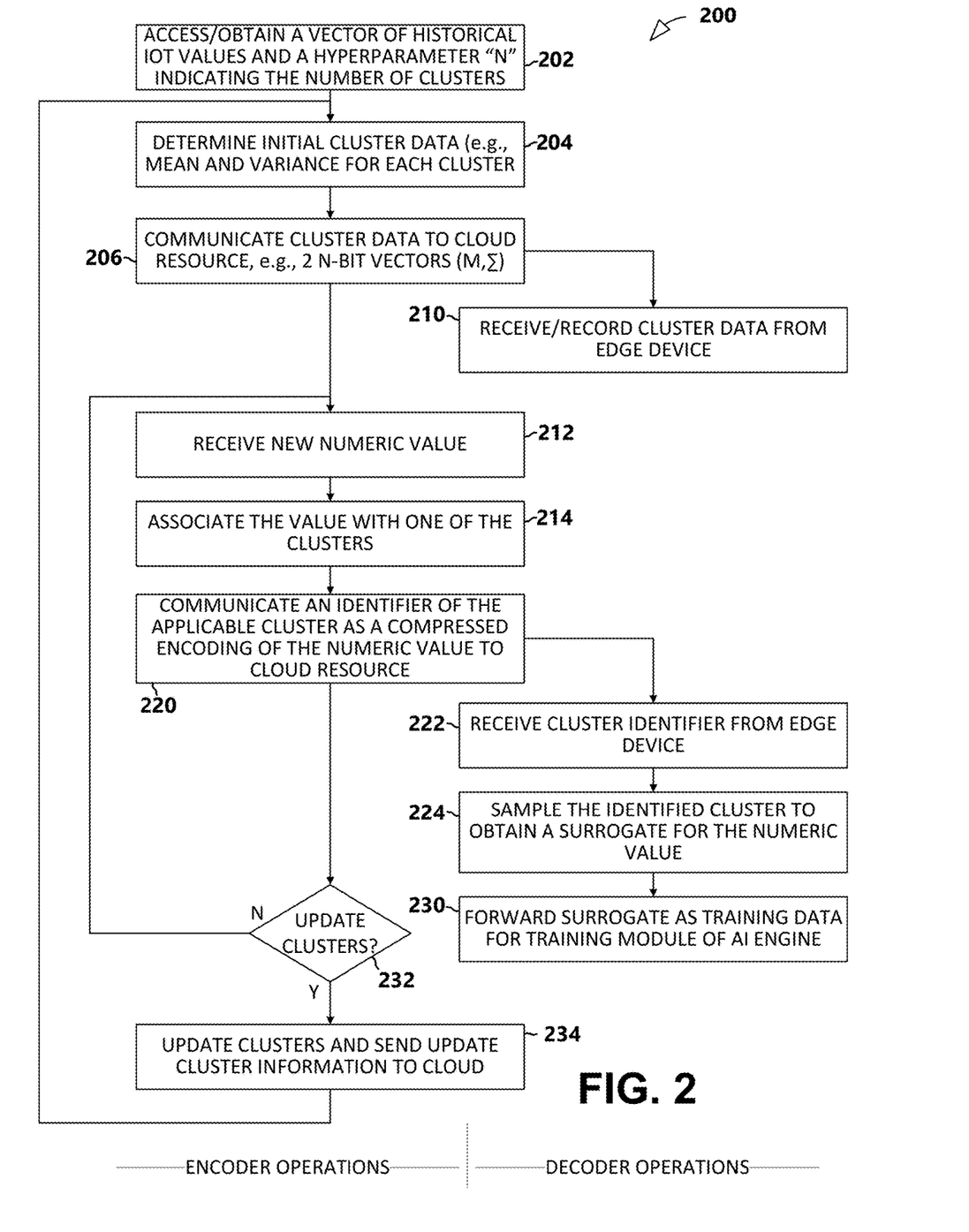
FIG. 2 illustrates a flow diagram of an AI training method.

Turning now to FIG. 2, a sequence diagram 200 illustrates a method of efficiently communicating training data from an edge device in accordance with a first aspect disclosed subject matter. The sequence diagram 200 illustrated in FIG. 2 includes a left column of operational blocks corresponding to actions performed by edge device 120 (FIG. 1) and a right column of operational blocks corresponding to actions performed by decoder 132 (FIG. 1).

As illustrated in FIG. 2, the edge device accesses or obtains (block 202) a vector of historical numeric values generated by the IoT unit. The edge device is also provided with a hyperparameter "n", which indicates the number of clusters to be used by the clustering algorithm. The edge device then determines (block 204) the cluster data 124 (FIG. 1) based on the historical numeric values and the number of clusters. The cluster data 124 may include two n-dimensional vectors of numeric values where the first vector includes a mean value for each cluster and the second vector includes a variance value, e.g., standard deviation, for each cluster. As illustrated in FIG. 2, the cluster data is communicated (block 206) from the edge device to the cloud resource.

After establishing the clusters in blocks 202-210, the edge device then receives (block 212) a new numeric value from the IoT unit and the clustering algorithm of the edge device determines (blocks 214) which one of the clusters the numeric value should be assigned to. For example, in a k-means clustering algorithm, new values will be assigned to the cluster having a mean value closest to the numeric value.

As illustrated in sequence diagram 200, the encoder communicates (block 220) an identifier of the applicable cluster, as a compressed encoding of the numeric value, to the decoder with the cloud computing resources. The decoder then receives (block 222) the cluster identifier from the edge device and generates (block 224) a sample of the identified cluster based on an underlying distribution of the cluster to obtain a surrogate for the numeric value generated by the IoT unit. The surrogate value may then be forwarded (block 230) to the training module 142 (FIG. 1) of AI engine 140. In this manner, the encoder generates a compressed encoding of a numerical value received from the IoT unit, transmits the compressed encoding, rather than the numeric value itself, to the cloud computing resources, and then produces a surrogate for the numeric value by sampling the applicable cluster before forwarding the surrogate value to a training module of an AI engine.

After the encoder communicates the compressed identifier to the decoder in block 220, the encoder repeats the process beginning at block 212 when the encoder next receives a numeric value from the IoT unit. Periodically or from time to time (block 232) in response to a specified criteria or event, the encoder may re-compute the clusters, update cluster information 124 accordingly and forward the updated cluster information to the decoder.

Figure 3:
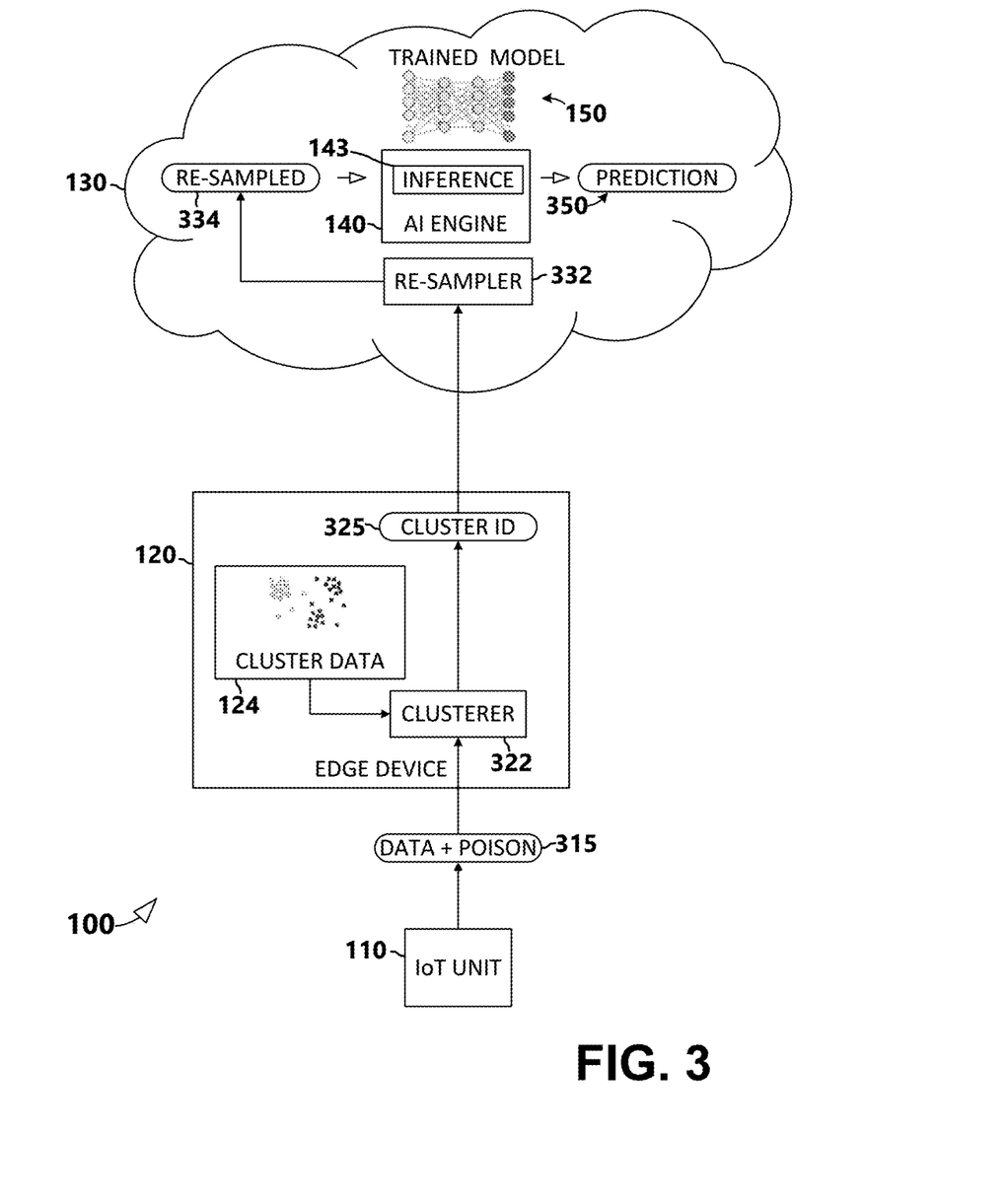
FIG. 3 illustrates an edge computing environment in accordance with a disclosed system for counteracting adversarial data injected into numeric values received from an IoT unit.
Figure 4:
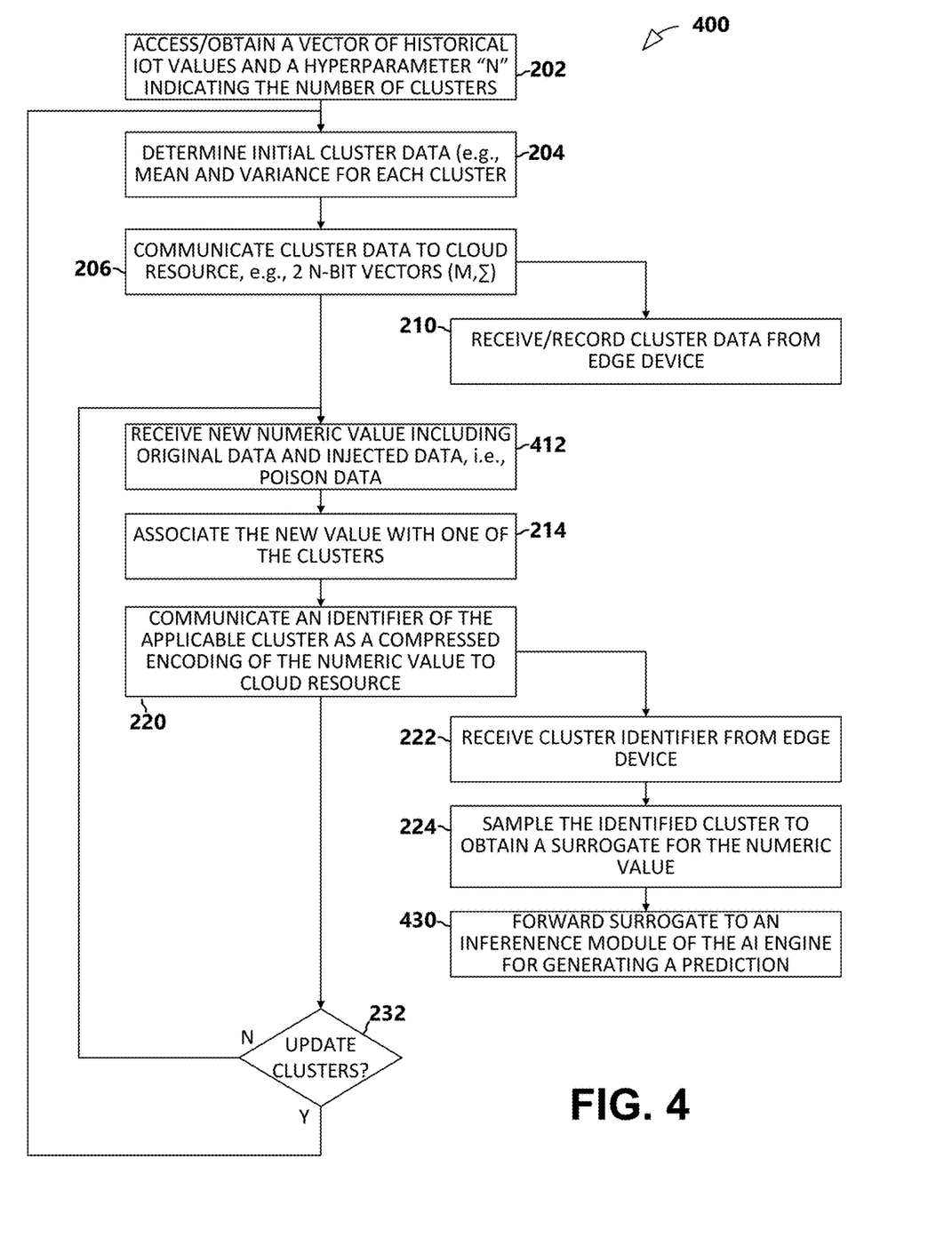
FIG. 4 illustrates a flow diagram of method for alleviating data poisoning on the edge.

Turning now to FIG. 3 and FIG. 4, a second aspect of disclosed edge computing systems and methods is illustrated. In this second aspect, the edge device may again perform a clustering algorithm to establish a plurality of "n" clusters based on a set of historic numeric values. In this second aspect, however, new values received by the edge device from the IoT unit from have been corrupted or poisoned, i.e., injected with adversarial data intended to subtlety but negatively influence the trained model of the AI engine. After the appropriate cluster for the numeric value, albeit a corrupted numeric value, is identified, a sample value from the cluster's underlying distribution is obtained and used as a surrogate for the corrupted numeric value. This surrogate value, which is free of the adversarial data injected into the numeric value received from the IoT unit, is provided to an AI engine that will draw an inference based on the surrogate value. By using the corrupted numeric value only to identify the appropriate cluster from which to draw an un-corrupted surrogate for the corrupted value, the adversarial data prevented from influencing the AI engine and the corresponding trained model.

FIGS. 3 and 4 share similarities with FIGS. 1 and 2 respectively. For the sake of brevity the following description emphasize the elements of FIG. 3 that differ from FIG. 1 and the elements of FIG. 4 that differ from FIG. 2.

Turning to FIG. 3, edge device 120 includes a clusterer 322, which calculates the cluster information 124 in the same manner as encoder 122 (FIG. 1). Clusterer 322 receives poisoned numeric data 315, i.e., data that original data from the IoT unit plus injected adversarial data. The poisoning of data 315 is presumably too subtle to be detected as an anomaly and therefore, when the numeric data 315 is evaluated by clusterer 322, the clusterer identifies the same cluster as it would have identified for the same numeric value without the poison. The cluster identifier 325, which is analogous to the compressed encoding 125 of FIG. 1, is forwarded to the cloud.

The cloud resources 130 illustrated in FIG. 3 includes a re-sampler 332 that receives cluster identifier 325 and generates resampled data 334 based on the probability density characteristics of the identified cluster analogous to the manner in which decoder 132 (FIG. 1) generates decoding 135 based on compressed encoding 125. The re-sampled data 334 is then provided to an inference module 143 of AI engine 140. It will be appreciated that resampled data 334 is a surrogate for poisoned numeric data 315 in the same way that decoding 135 (FIG. 1) is a surrogate for numeric data 115. In this case, however, the resampling achieves the additionally beneficial result of effectively preventing the poisoned data from reaching the AI engine. FIG. 3 further illustrates that the resampled data 143 is used to draw an inference and make a prediction 350. These elements contrast with the elements for AI training emphasized in FIG. 1.

Turning now to FIG. 4, elements of the illustrated sequence diagram 400 for alleviating poisoned data in an edge computing environment that are similar to corresponding elements of the sequence diagram 200 illustrated in FIG. 2 are represented with the same 2XX reference numerals whereas the elements of sequence diagram 400 that differ from elements in sequence diagram 200 include a 4XX reference numeral.

The method 400 illustrated in FIG. 4 includes essentially the same operations 202 through 210 for establishing a group of n clusters in accordance with a clustering algorithm and a set of historical numerical values that are illustrated and described in blocks 202 through 210 of FIG. 2.

The illustrated method 400 includes block 412, in which the clusterer 322 (FIG. 3) receives a poisoned numeric data 315 from the IoT unit 110 wherein the poisoned numeric value 315 includes original data plus injected data or poisoned data as previously discussed. The illustrated method 400 identifies(block 214) the cluster to which the applicable clustering algorithm is assigned analogous to the operation of block 214 of FIG. 2. Again, however, the poisoning of the data from the IoT unit may be too subtle to be detected as anomaly or to alter the cluster assignment.

For purposes of preventing the poisoned data from reaching the AI unit 140 and potentially and detrimentally altering the corresponding trained model 150, resampled data 334 is obtained by re-sampler 332 as a surrogate for poisoned numeric data 315. Resampled data 334 is then provided, in lieu of the poised numeric data 315 value received from the IoT unit, to an inference module 143 of the AI engine. In some embodiments, including the embodiment of method 400 illustrated in FIG. 4, the resampler 332 is implemented as a cloud computing resource while in other embodiments, the resampler may reside on the edge device.

For the embodiment illustrated in FIG. 4, in which the resampler 332 of FIG. 3 is located in the cloud, the illustrated method includes the resampler receiving (block 222) the cluster identifier 325 from clusterer 322. Resampler 334 may then generate a sample (block 224) from the identified cluster based on the cluster's underlying distribution and the sample may then be provided (block 430) to an inference module of the AI engine 140 (FIG. 1).

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system, comprising:
   an edge device, communicatively coupled to a cloud computing resource, wherein the edge device is configured to perform edge operations including:
      responsive to receiving, from an internet of things (IoT) unit, a numeric value for a parameter of interest, determining a compressed encoding for the numeric value in accordance with a lossy compression algorithm;
      transmitting the compressed encoding of the numeric value to the cloud computing resource; and
   a decoder, communicatively coupled to the encoder, configured to perform cloud operations including:
      responsive to receiving the compressed encoding, generating a surrogate for the numeric value in accordance with a probability distribution applicable to the parameter of interest; and
      providing the estimate of the numeric value as training date for an artificial intelligence engine of the cloud computing resource.

2. The information handling system of claim 1, wherein the lossy compression algorithm comprises a clustering algorithm for assigning the numeric value to a cluster selected from a plurality of clusters derived from historical data and wherein the surrogate comprises an identifier of the selected cluster.

3. The information handling system of claim 2, wherein the clustering algorithm comprises a k-means clustering algorithm.

4. The information handling system of claim 2, wherein the edge operations include:
   determining the plurality of clusters, wherein each of the plurality of clusters is identified by a mean value and a variance value; and
   conveying information indicative of the plurality of clusters to the cloud resource.

5. The information handling system of claim 4, wherein determining the plurality of clusters includes:
   accessing a hyperparameter indicative of a cluster count (n) corresponding to the number of clusters in the plurality of clusters; and
   performing the clustering algorithm on a vector of historical values in accordance with the cluster count.

6. The information handling system of claim 5, wherein the information indicative of the plurality of clusters includes:
   a first n-dimension vector comprising a mean value for each of the n clusters; and
   a second n-dimension vector comprising a variance value for each of the n clusters.

7. The information handling system of claim 2, wherein generating the estimate includes approximating a density function of the cluster.

8. The information handling system of claim 1, wherein generating the estimate injects random noise into the surrogate.

9. The information handling system of claim 1, further comprising, updating the plurality of clusters from time to time.

10. A method comprising:
   responsive to receiving, from an internet of things (IoT) unit, a numeric value for a parameter of interest, determining a compressed encoding for the numeric value in accordance with a lossy compression algorithm;
   transmitting the compressed encoding of the numeric value to a cloud computing resource;
   responsive to receiving the compressed encoding, generating a surrogate for the numeric value in accordance with a probability distribution applicable to the parameter of interest; and
   providing the estimate of the numeric value as training date for an artificial intelligence engine of the cloud computing resource.

11. The method of claim 10, wherein the lossy compression algorithm comprises a clustering algorithm for assigning the numeric value to a cluster selected from a plurality of clusters derived from historical data and wherein the surrogate comprises an identifier of the selected cluster.

12. The method of claim 11, wherein the clustering algorithm comprises a k-means clustering algorithm.

13. The method of claim 11, wherein the edge operations include:
   determining the plurality of clusters, wherein each of the plurality of clusters is identified by a mean value and a variance value; and
   conveying information indicative of the plurality of clusters to the cloud resource.

14. The method of claim 13, wherein determining the plurality of clusters includes:
   accessing a hyperparameter indicative of a cluster count (n) corresponding to the number of clusters in the plurality of clusters; and
   performing the clustering algorithm on a vector of historical values in accordance with the cluster count.

15. The method of claim 14, wherein the information indicative of the plurality of clusters includes:
   a first n-dimension vector comprising a mean value for each of the n clusters; and
   a second n-dimension vector comprising a variance value for each of the n clusters.

16. The method of claim 11, wherein generating the estimate includes approximating a density function of the cluster.

17. The method of claim 10, wherein generating the estimate injects random noise into the surrogate.

18. The method of claim 10, further comprising, updating the plurality of clusters from time to time.

\* \* \* \* \*